United States Patent
Cho et al.

(10) Patent No.: US 8,125,021 B2
(45) Date of Patent: Feb. 28, 2012

(54) NON-VOLATILE MEMORY DEVICES INCLUDING VARIABLE RESISTANCE MATERIAL

(75) Inventors: Choong-Rae Cho, Gimhae-si (KR); Eun-Hong Lee, Anyang-si (KR); El Mostafa Bourim, Yongin-si (KR); Chang-Wook Moon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/785,478

(22) Filed: Apr. 18, 2007

(65) Prior Publication Data

US 2007/0252193 A1 Nov. 1, 2007

(30) Foreign Application Priority Data

Apr. 28, 2006 (KR) .................. 10-2006-0038844

(51) Int. Cl.
*H01L 29/88* (2006.01)
(52) U.S. Cl. ............... 257/325; 257/1; 257/2; 257/3; 257/4; 257/5; 257/306; 257/312; 257/E29.024; 257/E29.17; 257/E29.342; 257/E29.344; 257/E51.014; 365/100; 365/148
(58) Field of Classification Search .......... 257/1–5, 257/306, 312, 325, E29.342, E29.344, E5.014, 257/E29.024, E29.17, E51.014; 365/100, 365/148
See application file for complete search history.

(56) References Cited

U.S. PATENT DOCUMENTS

| | | | | |
|---|---|---|---|---|
| 6,063,639 A | * | 5/2000 | Kim et al. | 438/3 |
| 2002/0081752 A1 | * | 6/2002 | Kim et al. | 438/3 |
| 2002/0154470 A1 | * | 10/2002 | Walsh | 361/523 |
| 2003/0122122 A1 | * | 7/2003 | Iwata | 257/43 |
| 2005/0151156 A1 | | 7/2005 | Wu et al. | |
| 2005/0242366 A1 | * | 11/2005 | Parikh et al. | 257/104 |
| 2005/0247921 A1 | * | 11/2005 | Lee et al. | 257/2 |
| 2006/0054950 A1 | * | 3/2006 | Baek et al. | 257/295 |
| 2006/0098472 A1 | * | 5/2006 | Ahn et al. | 365/145 |
| 2007/0166967 A1 | * | 7/2007 | Ichinose et al. | 438/510 |

FOREIGN PATENT DOCUMENTS

CN  1763985  4/2006

OTHER PUBLICATIONS

Lee Ching-Ting et al., Mechanism Investigation of NiOx in Au/Ni/p-Type GaN Ohmic Contacts Annealed in Air, Journal of Electronic Materials, vol. 32, No. 5, 2003, pp. 341-345.*
Irwin et al., p-type semiconductor nickel oxide as an efficient-enhancing anode interfacial layer in polymer bulk-heterojunction solar cells, PNAS, vol. 105, No. 8, Feb. 2008, p. 2783.*

(Continued)

*Primary Examiner* — Eugene Lee
*Assistant Examiner* — Peniel M Gumedzoe
(74) *Attorney, Agent, or Firm* — Harness, Dickey & Pierce, P.L.C.

(57) ABSTRACT

A non-volatile memory device includes a first oxide layer, a second oxide layer and a buffer layer formed on a lower electrode. An upper electrode is formed on the buffer layer. In one example, the lower electrode is composed of at least one of Pt, Ru, Ir, IrOx and an alloy thereof, the second oxide layer is a transition metal oxide, the buffer layer is composed of a p-type oxide and the upper electrode is composed of a material selected from Ni, Co, Cr, W, Cu or an alloy thereof.

5 Claims, 8 Drawing Sheets

OTHER PUBLICATIONS

Wu et al., Giant Dielectric Permittivity Observed in Li and Ti doped NiO, Phys. Rev. Let., 89, No. 21, p. 217601-1.*
Sato et al., Transparent conducting p-type NiO thin films prpared by magnetron sputtering, Thin Solid Films, vol. 236, pp. 27-31, 1993.*
Ohya et al., Oxide Thin Film Diode Fabricated by Liquid-Phase method, Jpn. J. Appl. Phys, vol. 35, pp. 4738-4742, 1996.*
Baek et al., Multi-layer Cross point Binary Oxide Resistive Memory (OXRRAM) for Post-NAND Storage Application, IEEE, 2005.*
Lee et al., Mechanism Investigation of NiOx in Au/Ni/p-type GAN Ohmic Contacts Annealed in Air, Journal of Electronic Materials, vol. 32, No. 5, 2003, p. 341-345.*
Chinese Office Action dated Sep. 25, 2009 in corresponding Chinese Application No. 200610142401.6 with English translation.
Chinese Office Action dated Jul. 29, 2011 in corresponding Chinese Application No. 200610142401.6 with English translation.

* cited by examiner

NON-VOLATILE MEMORY DEVICES INCLUDING VARIABLE RESISTANCE MATERIAL

PRIORITY STATEMENT

This non-provisional U.S. patent application claims priority under 35 U.S.C. §119 to Korean Patent Application No. 10-2006-0038844, filed on Apr. 28, 2006, in the Korean Intellectual Property Office (KIPO), the entire contents of which is incorporated herein by reference.

BACKGROUND

Description of the Related Art

Related art semiconductor memory devices include a relatively large number of memory cells connected by circuits. In a dynamic random access memory (DRAM), for example, a unit memory cell may comprise one switch and one capacitor. A DRAM may have a relatively high integration density and operating speed. However, DRAMs are volatile in that when the power supply is shut down, DRAMs lose stored data.

In related art non-volatile memory devices, such as flash memory devices, stored data is maintained even when the power is cut off. Unlike volatile memory devices, non-volatile memory retains data when power is shut-off; however, related art non-volatile memory devices have lower integration density and/or operating speed than volatile memories, such as, DRAMs.

Related art non-volatile memory devices include magnetic random access memories (MRAMs), ferroelectric random access memories (FRAMs), phase-change random access memories (PRAMs), resistance random access memories (RRAMs), and the like.

Figure 1A:
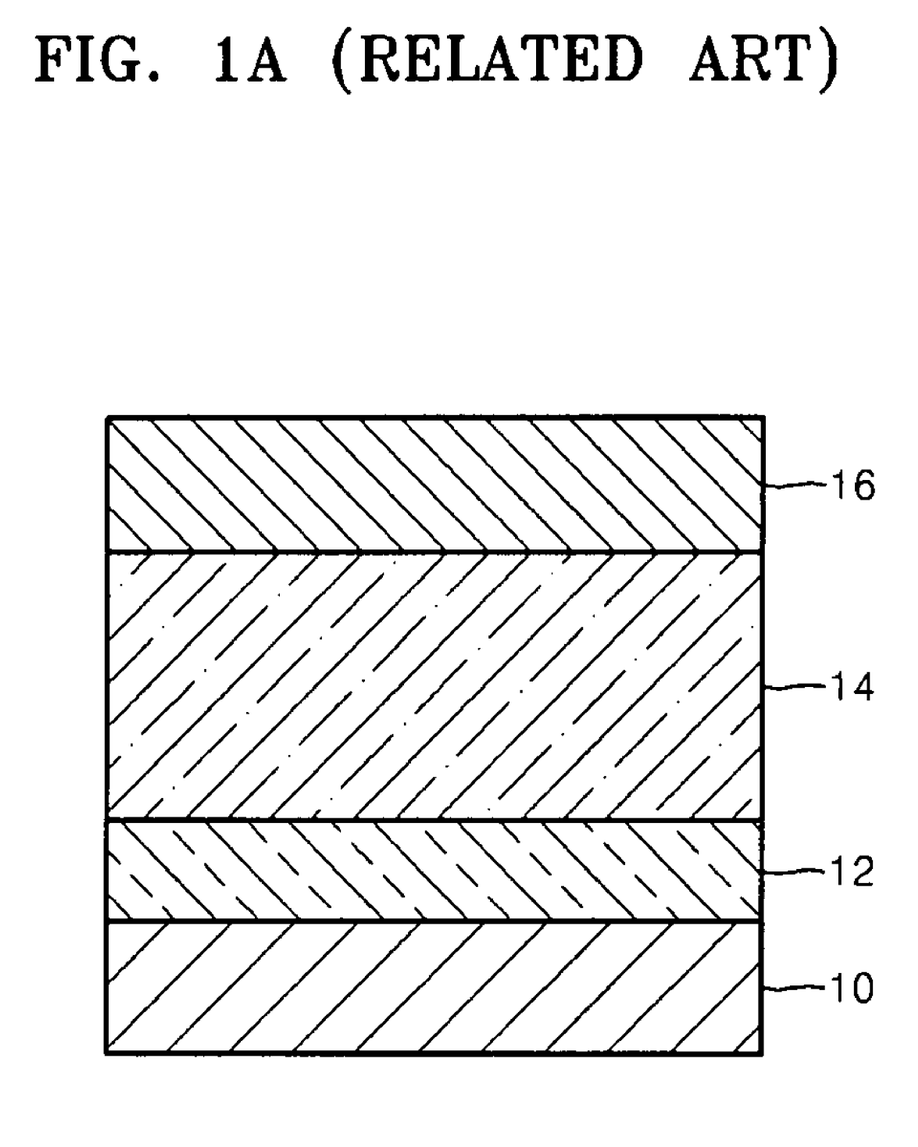
FIG. 1A illustrates a structure of a related art non-volatile memory device.

In a related art non-volatile memory device such as the PRAM, the resistance of a transition metal oxide is varied in accordance with voltage applied to the transition metal oxide. FIG. 1A illustrates a structure of a related art PRAM including a variable resistance material. A PRAM using transition metal oxide (TMO) as the variable resistance material has switching characteristics enabling use as a memory device.

Referring to FIG. 1A, a lower electrode 12, an oxide layer 14, and an upper electrode 16 may be sequentially formed on a substrate 10. The lower electrode 12 and the upper electrode 16 may be composed of a conductive material such as metal, and the oxide layer 14 may be composed of a transition metal oxide having variable resistance characteristics. Examples of the transition metal oxide include ZnO, $TiO_2$, $Nb_2O_5$, $ZrO_2$, NiO, and the like. However, increasing integration of these types of related art PRAMs may be more difficult to fabricate due to their structural characteristics.

Figure 1B:
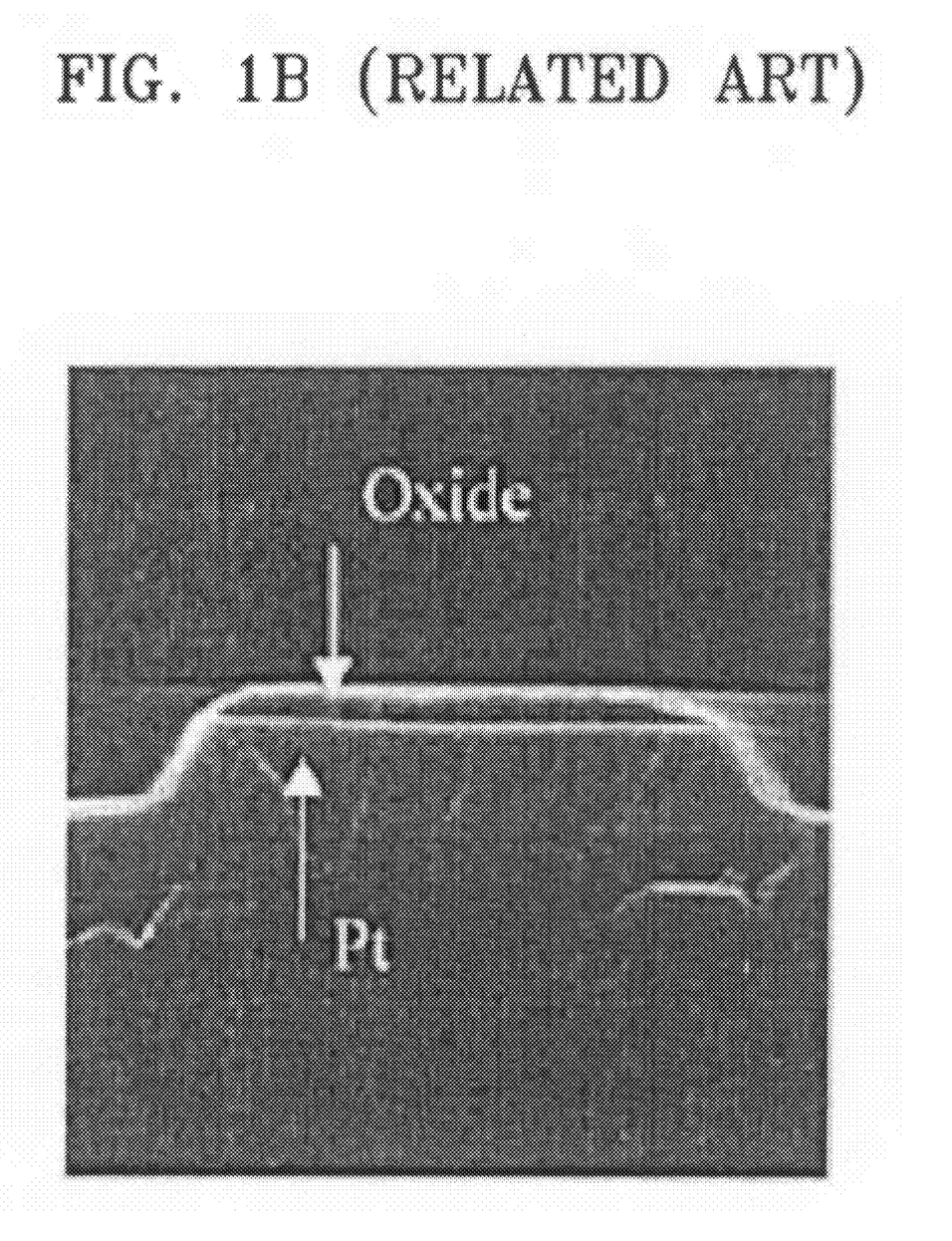
FIG. 1B illustrates a potential problem occurring during an etch process on the related art non-volatile memory device when using Pt for an upper electrode.

FIG. 1B illustrates a potential problem occurring during an etch procession a related art non-volatile memory device when using Pt for an upper electrode. As shown, a process of forming a related art electrode (e.g., upper electrode 16) may also be relatively difficult if the electrode has an etch slope of about 40 degrees. Furthermore, when a precious metal such as Pt is used to form the electrode, fabrication costs in the production of memory devices increase.

SUMMARY

Example embodiments relate to non-volatile memory devices, for example, non-volatile memory devices using variable resistance material providing stable switching characteristics by employing a plurality of oxide layers. Non-volatile memory devices, according to example embodiments, may operate without a separate switching device such as a diode or a transistor, and may have an improved electrode structure in which a p-type oxide layer may be disposed below an upper electrode.

Example embodiments provide non-volatile memory devices having a simplified and/or improved structure, which may be more suitable for higher integration and/or more stable electrical characteristics.

According to at least one example embodiment, a non-volatile memory device may include a variable resistance material. In at least this example embodiment, a non-volatile memory device may include a lower electrode, a first oxide layer formed on the lower electrode, and a second oxide layer formed on the first oxide layer. The second oxide layer may have variable resistance characteristics. A buffer layer may be formed on the second oxide layer and an upper electrode may be formed on the buffer layer.

The second oxide layer may be comprised of a p-type transition metal oxide. The p-type transition metal oxide may be, for example, a Ni oxide or the like. The buffer layer may be comprised of a p-type oxide. The p-type oxide may comprise at least one material selected from $NiO_{(1+x)}$ ($0<x<1$), NiO doped with Li, Na, La, Cu deficient Cu oxide and the like. The upper electrode may be comprised of a material selected from Ni, Co, Cr, W, Cu, an alloy of these materials or the like. The first oxide may be comprised of an n-type oxide. The n-type oxide may be, for example, Ru oxide, Zn oxide or the like.

BRIEF DESCRIPTION OF THE DRAWINGS

Example embodiments will become more apparent by describing in detail the attached drawings in which.

DETAILED DESCRIPTION OF EXAMPLE EMBODIMENTS

Various example embodiments will now be described more fully with reference to the accompanying drawings in which some example embodiments are shown. In the drawings, the thicknesses of layers and regions are exaggerated for clarity.

Detailed illustrative example embodiments are disclosed herein. However, specific structural and functional details disclosed herein are merely representative for purposes of describing example embodiments. This invention may, however, may be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element or layer is referred to as being "formed on" another element or layer, it can be directly or indirectly formed on the other element or layer. That is, for example, intervening elements or layers may be present. In contrast, when an element or layer is referred to as being "directly formed on" to another element, there are no intervening elements or layers present. Other words used to describe the relationship between elements or layers should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Figure 2:
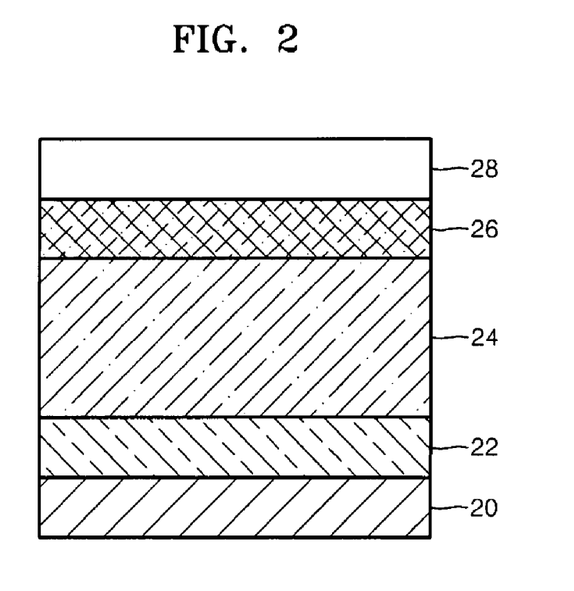
FIG. 2 is a view illustrating a non-volatile memory device including a variable resistance material, according to an example embodiment.

FIG. 2 is a view illustrating a non-volatile memory device including a variable resistance material, according to an example embodiment.

Referring to FIG. 2, non-volatile memory device, according to an example embodiment, may include a lower electrode 20, a first oxide layer 22, a second oxide layer 24, a buffer layer (e.g., a p-type buffer layer) 26 and an upper electrode 28. The first oxide layer 22, the second oxide layer 24, the p-type buffer layer 26 and the upper electrode 28 may be sequentially stacked on the lower electrode 20.

The lower electrode 20 may be comprised of metal, conductive metal oxide or the like. In at least one example embodiment, the lower electrode 20 may be composed of a material such as Pt, Ru, Ir, IrOx, a combination thereof or the like. The first oxide layer 22 may be composed of an n-type oxide, for example, Ru oxide, Zn oxide or the like. The second oxide layer 24 may be composed of a p-type oxide, for example, Ni Oxide or the like. The upper electrode 28 may function to apply voltage to the second oxide layer 24. In at least one example embodiment, a positive voltage may be applied to the second oxide layer 24 via the upper electrode 28.

The upper electrode 28 may be composed of a precious metal such as Pt or the like. However, Pt may incur a relatively low etch rate during a dry etch process for forming an electrode, and may generate a non-volatile etch by-product such as PtClx. As shown in FIG. 1B, and discussed above, related art processes of forming the electrode may be more difficult because the electrode has an etch slope of about 40 degrees. Furthermore, when a precious metal such as Pt is used, fabrication costs in the production of memory devices may increase. Consequently, in at least one example embodiment, the upper electrode 28 may be formed using a metal, metal alloy or any suitable conductive material. For example, the upper electrode 28 may be formed using Ni, Co, Cr, W, Cu, an alloy of these materials or the like.

According to at least some example embodiments, an upper electrode formed of Pt may produce more stable characteristics as compared to when the upper electrode 28 is formed of a metal such as Ni, Co, Cr or the like.

Because a work function of a noble metal such as Pt is relatively high, for example, about 5.34, and the noble metal forms an ohmic contact with the second oxide layer 24 composed of a p-type oxide under the upper electrode 28, a positive voltage applied from the upper electrode 28 may be accumulated on a node material.

Figure 3A:
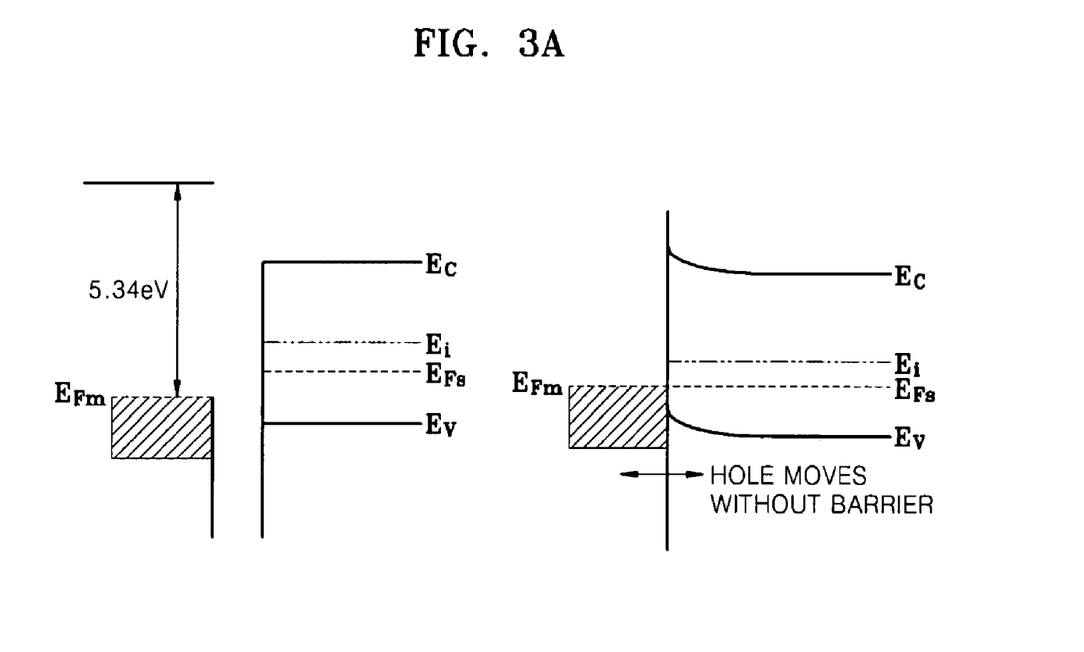
FIG. 3A illustrates an energy band diagram and an ohmic contact diagram when a first oxide layer is made by forming RuOx or ZnO on an Ru lower electrode, and a NiO second oxide layer and a Pt upper electrode are formed on the first oxide layer.

FIG. 3A illustrates an energy band diagram (left) and an ohmic contact diagram (right) for a non-volatile memory device, according to an example embodiment. In this example embodiment, a first oxide layer 22 composed of RuOx or ZnO is formed on a lower electrode 20 composed of Ru. A second oxide layer 24 composed of Ni Oxide and an upper electrode 28 composed of Pt are formed on the first oxide layer 22.

When the upper electrode 28 is composed of a metal such as Ni, Co, Cr, and the like, the work function of the metal is relatively low and a Schottky barrier may form at the interface between the upper electrode 28 and the second oxide layer 24, which is composed of, for example, Ni Oxide. When a Schottky barrier is formed between the second oxide layer 24 and the upper electrode 28, a voltage drop phenomenon may occur and the memory node may deteriorate due to the influence of a junction resistance. This may deteriorate operating characteristics of the memory device.

Figure 3B:
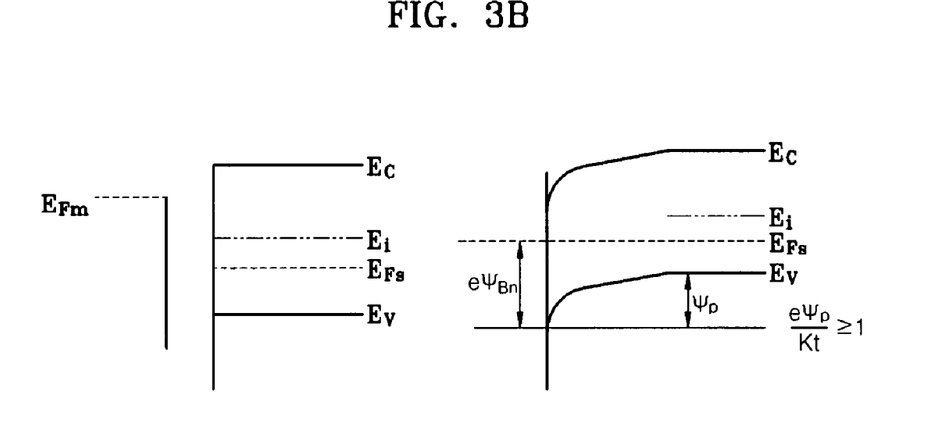
FIG. 3B illustrates an energy band diagram and a Schottky barrier diagram when a first oxide layer is made by forming RuOx or ZnO on an Ru lower electrode, and a second oxide layer made of NiO and an upper electrode made of a normal metal such as Ni, Cr, Cu, or W are formed on the first oxide layer.

FIG. 3B illustrates an energy band diagram (left) and a Schottky barrier diagram (right) for a non-volatile memory device, according to an example embodiment. In this example embodiment, a first oxide layer 22 composed of RuOx or ZnO is formed on a lower electrode 20 composed of Ru. A second oxide layer 24 composed of Ni Oxide (NiO) and an upper electrode 28 composed of a metal such as Ni, Cr, Cu, or W are formed on the first oxide layer 22.

When the upper electrode 28 is composed of normal metals such as Ni, Cr, Cu, or W, memory devices, according to at least some example embodiments, the buffer layer 26 may be disposed between the second oxide layer 24 and the upper electrode 28 to form an ohmic contact at the interface with the second oxide layer 24.

In at least one example embodiment, the buffer layer 26 may be composed of a p-type oxide, for example, or any other similar oxide material may be used. When the second oxide layer 24 is composed of NiO, the buffer layer 26 may be composed of $NiO_{(1+x)}$ ($0<x<1$). In this example, the content of Ni in the buffer layer 26 may be relatively small compared to the NiO of the second oxide layer 24. In another example, the p-type buffer layer 26 may be composed of NiO doped with Li, Na, La, or the like. In yet another example embodiment, the p-type buffer layer 26 may be composed of Cu deficient CuOx. A concentration of carriers in the p-type oxide forming the buffer layer 26 may be about $10^{17}/cm^3$. The materials described above are all p-type oxides, and the buffer layer 26 is formed between the second oxide layer 24 and the upper electrode 28, to form an ohmic contact structure. Although only a Ni deficient NiO material, NiO doped with Li, Na, La, and the like and a Cu deficient CuOx material are discussed above, the p-type layer 26 may be composed of any suitable oxide material.

Figure 3C:
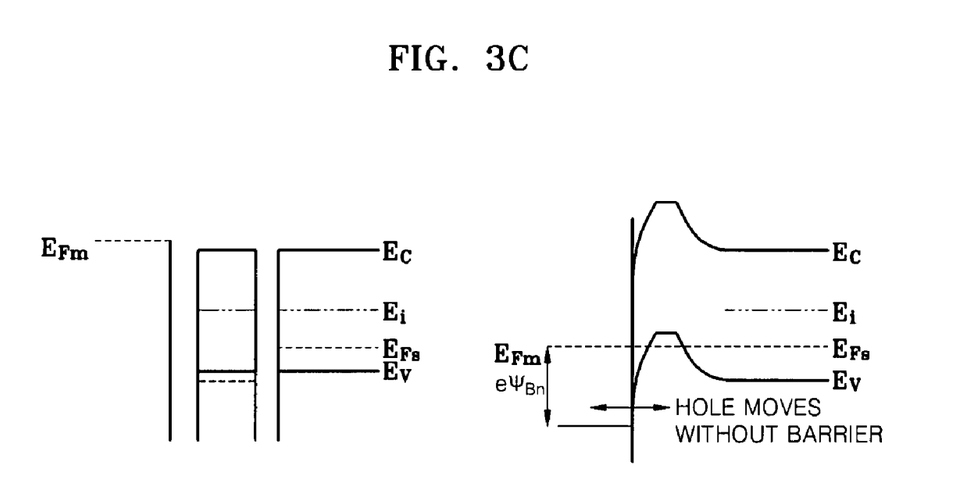
FIG. 3C illustrates an energy band diagram and an ohmic contact diagram when a first oxide layer made of RuOx or ZnO is formed on an Ru lower electrode, and a second oxide layer made of NiO, a p-type buffer layer, and an upper electrode made of a normal metal such as Ni, Cr, Cu, or W are formed on the first oxide layer.

FIG. 3C illustrates an energy band diagram and an ohmic contact diagram for a non-volatile memory device, according to another example embodiment. In this example, a first oxide layer 22 composed of RuOx or ZnO is formed on a lower electrode 20 composed of Ru. A second oxide layer 24 composed of NiO, a p-type buffer layer 26 and an upper electrode 28 composed of a metal such as Ni, Cr, Cu, W or the like are formed on the first oxide layer 22.

A non-volatile memory device, according to at least some example embodiments, as described above may be fabricated using PVD, atomic layer deposition (ALD), CVD processes using sputtering or any other suitable process. Thicknesses of the lower electrode 20, the first oxide layer 22, the second oxide layer 24, the buffer layer 26 and the upper electrode 28 may be between several nanometers and several micrometers. FIG. 2 illustrates the structure of a unit device; however, non-volatile memory devices including a variable resistance material, according to example embodiments, may be used in a cross-point type memory device. A memory device, according to example embodiments, may have a plurality of (e.g., two) resistance states.

Figure 7:
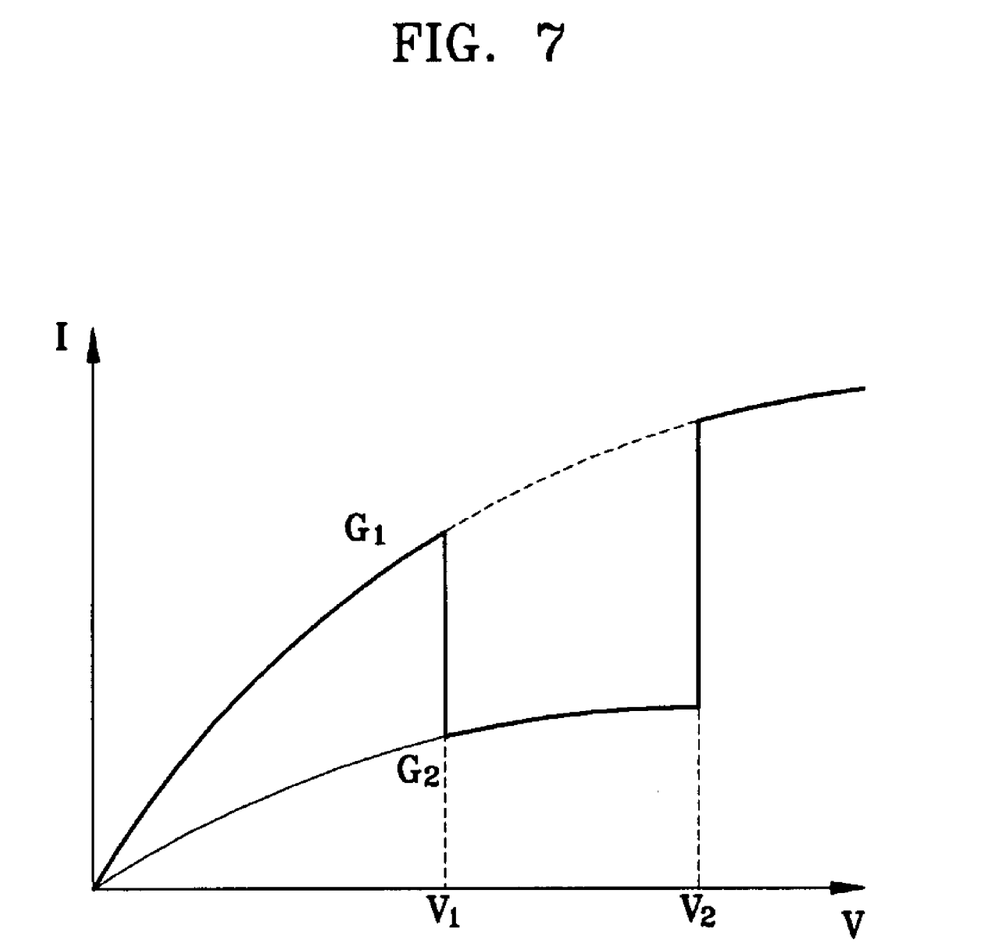
FIG. 7 is a graphical representation illustrating operating characteristics of a non-volatile memory device, according to an example embodiment.

FIG. 7 is a graphical representation illustrating operating characteristics of a non-volatile memory device, according to an example embodiment.

Referring to FIG. 7, when a voltage is gradually increased from 0 V, a current may increase in proportion to the voltage along plot $G_1$. However, when a voltage of $V_1$ or higher is applied, current decreases because resistance increases. Current increases along plot $G_2$ when a voltage between $V_1$ and $V_2$ is applied, and when voltage of $V_2$ or higher is applied, resistance decreases and current again increases along plot $G_1$. Electrical characteristics of the memory device when a voltage higher than $V_1$ is applied may influence electrical characteristics of the memory device when a voltage lower than $V_1$ is applied later.

After applying a voltage in a range of between about $V_1$ and about $V_2$, inclusive, to the memory device, when a voltage lower than $V_1$ is applied again, a measured current may follow the current value along the plot $G_2$. On the other hand, after a voltage higher than $V_2$ is applied to the memory device, when a voltage lower than V, is applied, a measured current may follow the current value along the plot $G_1$ of FIG. 7. As such, the electrical characteristics for an applied voltage higher than $V_1$ (e.g., a range of $V_1$ to $V_2$ or higher than $V_2$) may influence the memory device.

In example embodiments, a variable resistance material, (e.g., a transition metal oxide) may be used to form a memory device, such as, a non-volatile memory device. For example, a state of the memory device when a voltage in a range between $V_1$ and $V_2$ in FIG. 7 is applied may be designated as '0', and a state of the memory device when a voltage higher than $V_2$ is applied may be designated as '1' so as to record data. In order to read data, whether the data stored in the memory device is in a state of '0' or in a state of '1' may be detected by applying a voltage lower than $V_1$ and measuring a current flow in an oxide layer. In this example, designation of the states '1' and '0' may be selectively determined.

Figure 4A:
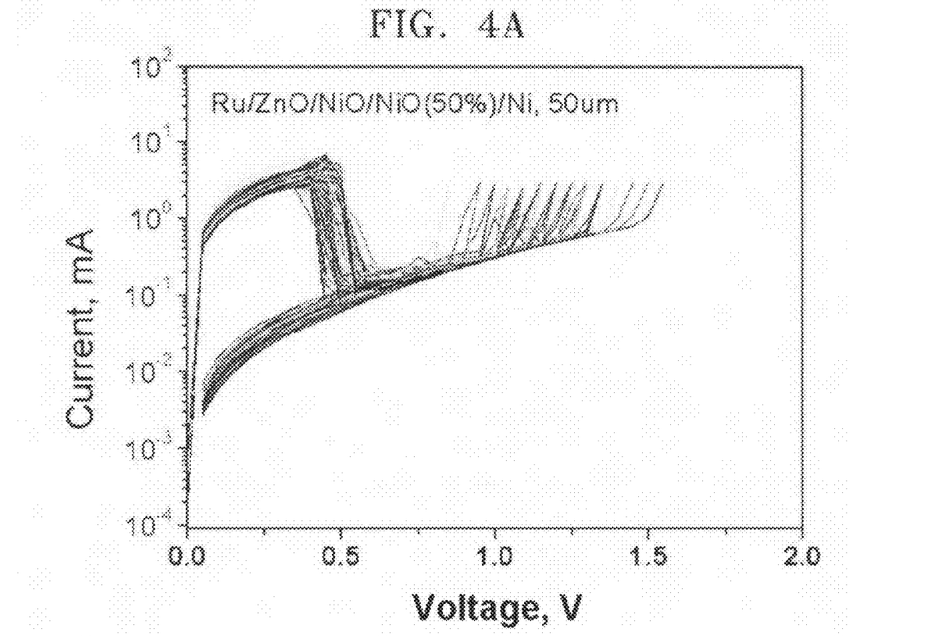
FIG. 4A is a graphical representation produced by the non-volatile memory device including a variable resistance material according to an embodiment of the present invention, in which the graphical representation illustrates currents of the non-volatile memory device with respect to applied voltages.

FIG. 4A is a graph of current versus voltage for a non-volatile memory device, according to an example embodiment. Referring to FIG. 4A, the graph illustrates currents of the non-volatile memory device with respect to applied voltages.

In this example embodiment, the non-volatile memory device includes a first oxide layer 22 composed of ZnO, a second oxide layer 24 composed of NiO, a buffer layer including Ni, which is reduced by 50% compared to that of the second oxide layer 24, and an upper electrode 28 composed of Ni. Each of the first oxide layer 22, the second oxide layer 24, the buffer 26 and the upper electrode 28 may be sequentially formed on a Ru lower electrode.

Figure 4B:
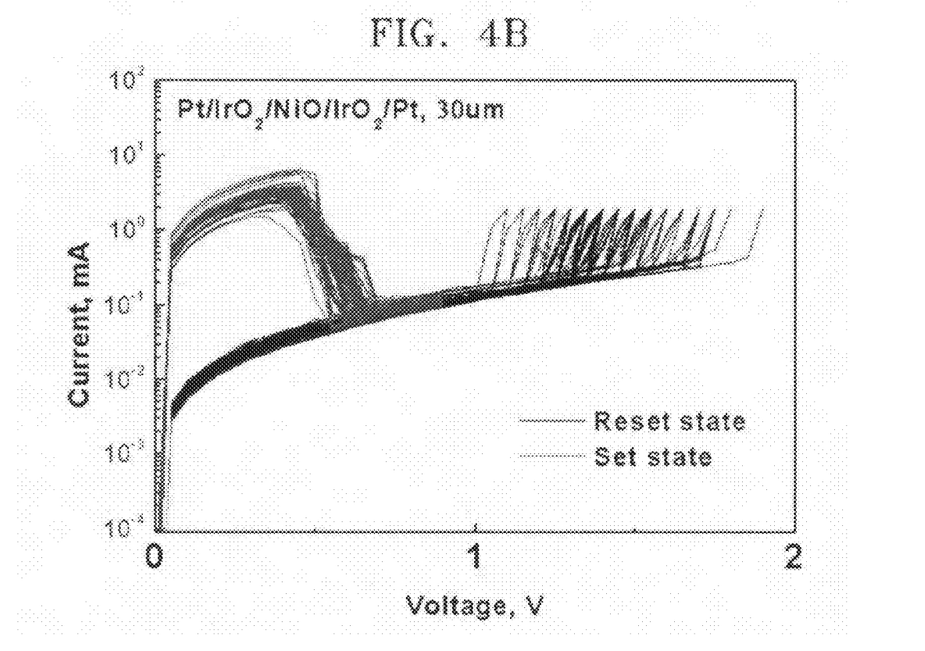
FIG. 4B is a graphical representation illustrating currents of the non-volatile memory device, in which an upper electrode is composed of Pt with respect to applied voltages.

FIG. 4B is a graph of current versus applied voltage for a non-volatile memory device, according to another example embodiment, in which a lower electrode 20 and an upper electrode 28 are composed of Pt. Comparing the graphs of FIGS. 4A and 4B, reproducibility of the graph and memory characteristics are similar.

Figure 5A:
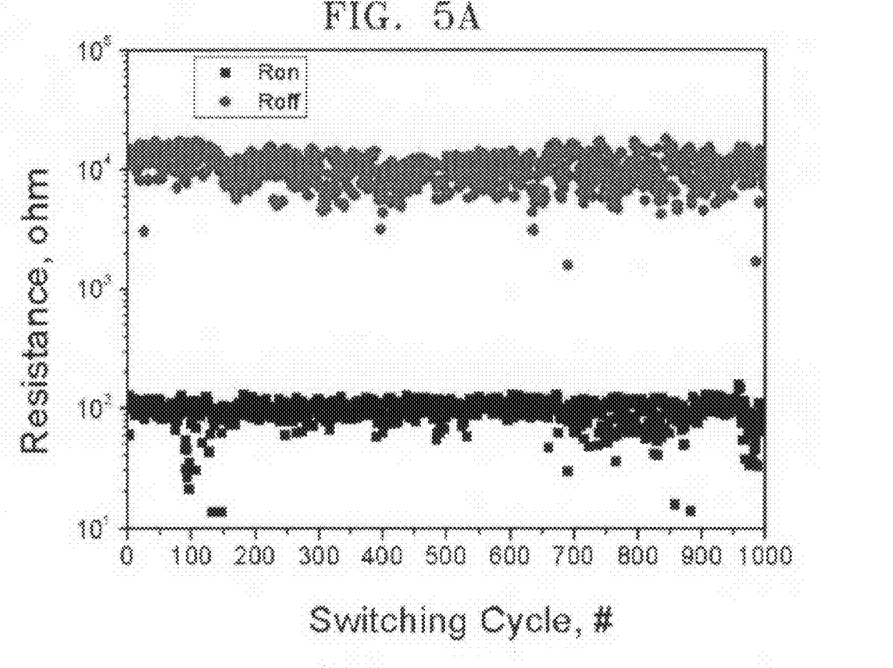
FIG. 5A illustrates measured results of resistance of a memory device, according to an example embodiment, with respect to the number of switching cycles.
Figure 5B:
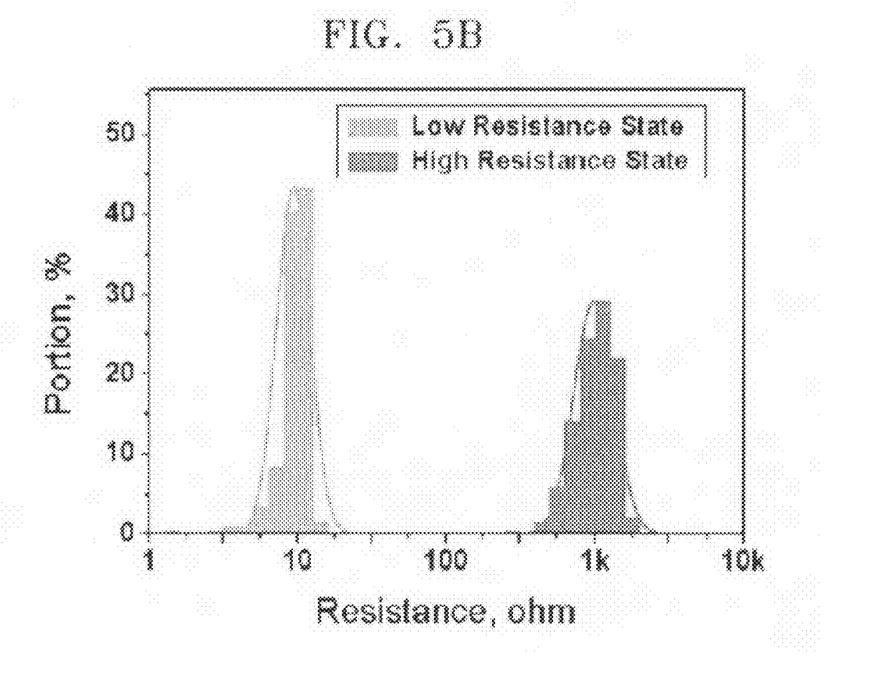
FIG. 5B illustrates measured results of a distribution of a memory device, according to an example embodiment, with respect to resistance.

FIG. 5A is a graph illustrating measured results of resistance of a non-volatile memory device, according to an example embodiment, with respect to a number of switching cycles. FIG. 5B is a graph illustrating measured results of a distribution of a non-volatile memory device, according to an example embodiment, with respect to resistance. The samples used in producing FIGS. 5A and 5B are the same as those discussed above with regard to FIG. 4A. Referring to FIGS. 5A and 5B, lower resistance state values Ron and higher resistance state values Roff may be constant or substantially constant even when the number of switching cycles is increased. Distribution may also be lower.

Figure 6A:
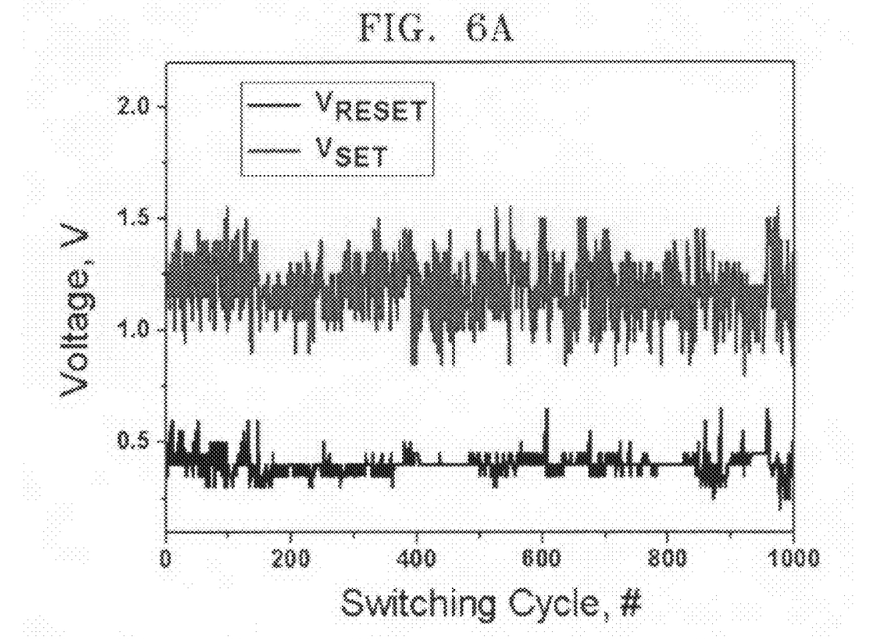
FIG. 6A illustrates measured results of voltage of a memory device, according to an example embodiment, with respect to the number of switching cycles.
Figure 6B:
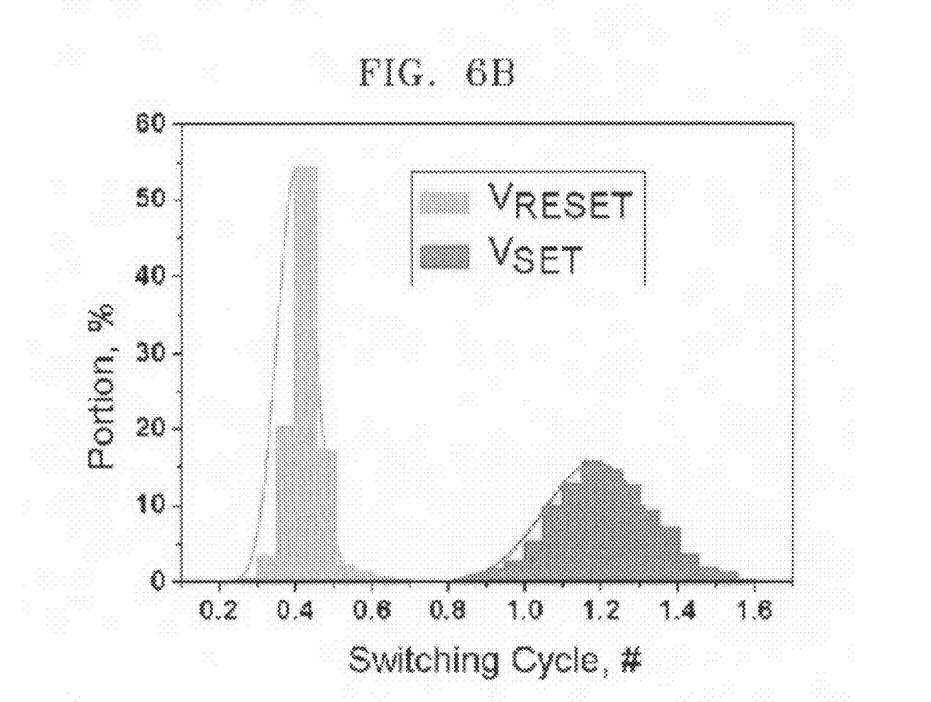
FIG. 6B illustrates measured results of a distribution of a memory device, according to an example embodiment, with respect to the number of switching cycles.

FIG. 6A is a graph illustrating measured results of voltage of a non-volatile memory device, according to an example embodiment, with respect to the number of switching cycles, and FIG. 6B is a graph illustrating measured results of a distribution of a non-volatile memory device, according to an example embodiment, with respect to the number of switching cycles.

The samples used to generate the graphs in FIGS. 6A and 6B are the same as those discussed above with regard to FIG. 4A. Referring to FIGS. 6A and 6B, lower set voltages and lower reset voltages show patterns and/or provide more reliable results even when the number of switching cycles is increased.

According to example embodiments, non-volatile memory devices including a variable resistance material may have a simpler structure, more stable switching characteristics and/or may be used as a cross-point type memory device, which may result in higher degree of integration. The non-volatile memory devices, according to example embodiments, may provide cost savings and/or more stable operating characteristics by forming a buffer layer between an upper electrode and/or a memory node. The non-volatile memory device, according to example embodiments, may be used in a cross-point type array structure of unit devices.

While example embodiments have been particularly shown and described with reference to the drawings thereof, it will be understood by those of ordinary skill in the art that various changes in form and details may be made therein without departing from the spirit and scope of the present invention as defined by the following claims.

What is claimed is:

1. A non-volatile memory device, comprising:
a lower electrode;
a single, first oxide layer including ruthenium (Ru) oxide or zinc (Zn) oxide directly formed on the lower electrode;
a single, second oxide layer including nickel (Ni) oxide for ohmic contact directly formed on the first oxide layer, and having variable resistance characteristics;
a buffer layer including a p-type oxide for ohmic contact formed on the second oxide layer, wherein a first ohmic contact is formed at an interface between the second oxide layer and the buffer layer; and
an upper electrode formed on the buffer layer, wherein a second ohmic contact is formed at an interface between the buffer layer and the upper electrode,
wherein the buffer layer includes at least one material selected from $NiO_{(1+x)}$ (wherein $0<x<1$) and Cu deficient Cu oxide, and
the upper electrode is composed of a metal having a work function lower than that of a noble metal.

2. The non-volatile memory device of claim 1, wherein the lower electrode is composed of at least one of Pt, Ru, Ir, $IrO_x$ and an alloy thereof.

3. The non-volatile memory device of claim 1, wherein the lower electrode is composed of Ru.

4. The non-volatile memory device of claim 1, wherein the upper electrode is composed of a material selected from Ni, Co, Cr, W, Cu or an alloy thereof.

5. A non-volatile memory device, comprising:
a lower electrode;
a single, first oxide layer including ruthenium (Ru) oxide or zinc (Zn) oxide formed directly on the lower electrode;
a single, second oxide layer including nickel (Ni) oxide for ohmic contact formed directly on the first oxide layer, and having variable resistance characteristics;
a buffer layer including a p-type oxide for ohmic contact formed on the second oxide layer, wherein an ohmic contact is formed at an interface between the second oxide layer and the buffer layer; and
an upper electrode formed on the buffer layer,
wherein the buffer layer includes at least one material selected from $NiO_{(1+x)}$ (wherein $0<x<1$), NiO doped with Li, Na or La, and Cu deficient Cu oxide, and
the upper electrode is composed of a material selected from Ni, Co, Cr, W or an alloy thereof.

* * * * *